United States Patent [19]
Rabut

[11] 3,777,238
[45] Dec. 4, 1973

[54] ARRANGEMENT FOR MOUNTING SEMI-CONDUCTIVE DEVICES TO HEAT SINKS

[75] Inventor: Eugene W. Rabut, Shelby Twp., Macomb County, Mich.

[73] Assignee: The Udylite Corporation, Warren, Mich.

[22] Filed: June 5, 1972

[21] Appl. No.: 268,223

Related U.S. Application Data

[63] Continuation of Ser. No. 88,341, Nov. 10, 1970, abandoned.

[52] U.S. Cl. ...... 317/234 R, 317/234 A, 317/234 B, 317/234 H, 174/15, 165/80
[51] Int. Cl. ............................. H01l 3/00, H01l 5/00
[58] Field of Search ......................... 317/234, 1, 1.5, 317/4, 4.1, 5.4; 174/15; 165/80, 105

[56] References Cited

UNITED STATES PATENTS

| | | | |
|---|---|---|---|
| 2,992,372 | 7/1961 | Himeon et al. | 317/234 |
| 3,668,477 | 6/1972 | Zellmer | 317/234 A |

FOREIGN PATENTS OR APPLICATIONS

| | | | |
|---|---|---|---|
| 792,440 | 8/1968 | Canada | 317/234 |
| 1,372,872 | 10/1964 | France | 317/234 |
| 1,425,031 | 12/1965 | France | 317/234 |

*Primary Examiner*—John W. Huckert
*Assistant Examiner*—Andrew J. James
*Attorney*—Harness, Dickey & Pierce

[57] ABSTRACT

This disclosure pertains to a rectifier system which includes a plurality of diodes in the secondary circuit of a main transformer to provide rectification for the energy flowing therefrom, and a plurality of semi-conductive rectifier devices for controlling current to the primary windings thereto. The diodes are stud mounted and adapted to be self locked between a pair of channel portions of an electrically conductive heat sink, whereas the semi-conductive rectifier devices are stud mounted to extending flange portions of a novel heat sink bracket. The bracket is comprised of a base portion wherefrom is extended from one surface an extending flange. A bore is disposed in the flange portion, a preselected distance from the base, for self lockingly receiving the semi-conductive rectifier device. The bracket itself is fastened to a main heat sink by means of an epoxy which is heat conductive and electrically insulated.

10 Claims, 6 Drawing Figures

INVENTOR.
Eugene W. Rabut
BY
Harness, Dickey & Pierce
ATTORNEYS.

INVENTOR.
Eugene W. Rabut
BY
Harness, Dickey & Pierce
ATTORNEYS.

ARRANGEMENT FOR MOUNTING SEMI-CONDUCTIVE DEVICES TO HEAT SINKS

This is a continuation of application Ser. No. 88,341, filed Nov. 10, 1970, now abandoned.

BACKGROUND AND SUMMARY OF THE DISCLOSURE

This invention relates generally to rectifier assemblies, and more particularly, to the installation means of connecting semi-conductive devices to heat sinks for the purpose of removing heat therefrom.

As is well known, the successful application of semi-conductive devices depends to a great extent on adequate cooling. If the junction temperature of the semi-conductive device is permitted to be raised beyond its specification, permanent damage may occur, and the device may fail prior to melting and thermal runaway, or its operating characteristics may be impaired. Further, the circuit itself may fail, before melting or thermal runaway in the semi-conductive device occurs, since insufficient cooling can reduce the forward breakover voltage, increase the semi-conductive device turn off time, when the result that the design characteristics are sufficiently outside of specification to induce circuit malfunction. For these reasons, all semi-conductive devices are designed with some type of heat transfer mechanism to dissipate internal heat losses.

When aluminum is used as the heat sink material due to its weight and ease of extruding, additional problems are presented in mounting the semi-conductive devices to the heat sink. When moist or corrosive atmospheres are expected, galvanic action between the aluminum and the copper stud may lead to gradual deterioration of the joint and an increase in thermal resistance. Further, when mounting copper studs to a fin through a clearance hole by means of a nut on the backside, relaxation and metal creep may cause the mounting to gradually loosen. This condition is accelerated by temperature cycling and is dependent upon the magnitude of the time-temperature relation. Also in many designs, due to space restrictions, one of the sides of the cooling fins may be inaccessible which could require a major disassembly for repair.

With the system of the present invention, a mounting and connection assembly has been evolved which eliminates or drastically reduces the aforementioned problems. In this system, an inwardly extending surface is provided to interfere with the flats of the hexagonal head of the semi-conductive device for restricting rotatable movement thereof. By the method advanced, therefore, it is only necessary to insert the semi-conductive device into a suitable bore in the heat sink and attach the nut and preferably a Belleville spring washer from an outward surface thereto.

In the instance of the controlled rectifier devices, a novel T-shaped bracket is provided having a web and an extending flange portion. The flange portion is disposed a preselected distance from a bore so that the flats on the hexagonal head of the controlled rectifier device are adapted to be restrained from rotation therearound. In the instance of the diode heat sink mounting arrangement, a pair of flange surfaces are disposed on the rearward side of the heat sink spaced a preselected distance apart and adapted to engage the points of the diodes to preclude rotational movement of the diodes. As set forth, the semi-conductive devices are then connected as by means of a suitable washer and nut combination.

Accordingly, it is a general object of the invention to provide an improved method for connecting a semi-conductive device to a heat sink.

It is another object of the present invention to provide an improved configuration for parallelling rectifying elements and interphase transformers.

It is still a further object of the present invention to provide an improved configuration for supporting parallelled rectifier diodes.

It is still another object of the present invention to provide an improved system for bussing the plurality of rectifying devices in a multiphase system to interphase transformer windings.

It is still another object of the invention to provide an improved system for cooling semi-conductive devices.

It is still a further object to provide an improved support assembly for the various semi-conductive devices.

It is still another object to reduce the number of insulators utilized in rectifying system.

It is a further object of the present invention to provide an improved rectifying system incorporating semi-conductive devices which is inexpensive to manufacture, reliable in use and which minimizes the down time of the system due to troubles or failure.

Other objects and advantages of the present invention will become apparent from the following detailed description taken in conjunction with the accompanying drawings.

DETAILED DESCRIPTION OF THE PREFERRED EMBODIMENTS

Figures 1, 2:
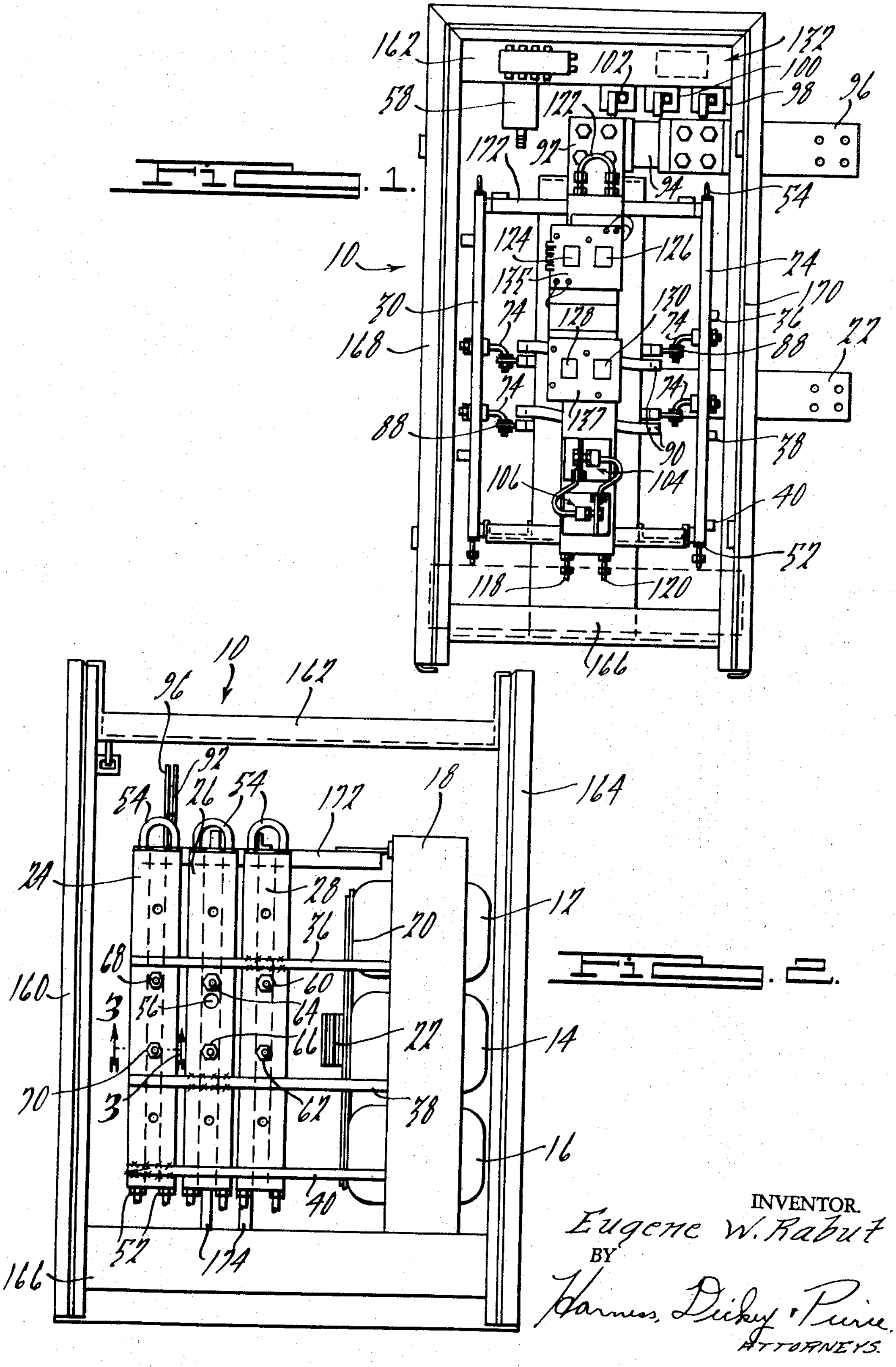
FIG. 1 is a front view of a rectifier assembly in a cabinet with the door removed and incorporating certain features of the present invention.
FIG. 2 is a side view of the rectifier assembly of FIG. 1, the assembly of FIG. 2 being illustrated with the exterior cabinet panels removed to illustrate the diode mounting assemblies and main input transformers.

With reference now to the drawings, a typical rectifying unit is indicated generally at 10 in FIGS. 1 and 2. The unit illustrated is adapted to convert a three phase alternating current to low voltage, high amperage direct current for use in a variety of processes which include electro-chemical plating and anodizing of metallic workpieces.

As best observed in FIG. 2, an electrical commercial power source is connected to a plurality of main transformer units 12, 14, 16, which form a three phase input system for the rectifying unit 10. The main transformer units 12, 14, 16 are supported by means of a support channel assembly 18, the details of which are not critical to the present invention. The secondary windings of the main transformer units 12, 14, 16 are center tapped, the center tap being in the form of a common bus bar 20 being connected to an output bus 22 which forms the positive terminal for the load circuit.

Also with respect to the secondary windings, the ends are interconnected with a plurality of diode-mounting heat sink assemblies 24, 26, 28, 30, 32, 34. The first three indicated assemblies are disposed on the right side of the rectifying unit 10 as illustrated in FIG. 1, while the latter three indicated assemblies are disposed on the left side, being directly and respectively numbered and directly behind the assemblies illustrated in FIG. 2. The conductors forming the connection between the end of the secondary windings of the main transformer units 12, 14, 16 and the diode heat sink assemblies 24, 26, 28, 30, 32, 34 are formed by bus bars 36, 38, 40, 36', 38', 40', the latter three being located on the left hand side of FIG. 1. The bus bar 36 (36') is interconnected by welding with the diode heat sink assembly 28 (34), the bus 38 (38') is welded to the heat sink assembly 26 (32), and the bus 40 (40') is welded to the heat sink assembly 24 (30). As is common in the art, the portions of the bus adjacent, but not connected to, the remaining diode heat sink support assemblies are provided with sufficient space to avoid corona and short circuiting or are provided with insulating elements interposed therebetween.

Referring particularly to the details of one of the heat sink assemblies 24, 26, 28, 30, 32, 34, the heat sink is preferably formed from an extruded aluminum channel (see FIGS. 3 and 4) having a generally flat web or base section 42 and a pair of fluid conducting channels, or flanges 44, 46 integrally extruded therewith, and disposed a preselected distance apart defining a rectangular vertically elongated recess 78, the purpose of which will become apparent as this specification proceeds.

With reference to FIG. 2, the flat web section 42 is oriented to face outwardly from the rectifying unit 10, with the fluid conducting channels 44, 46 being oriented inwardly toward the center of the rectifying unit 10. A vertical passage 48, 50 is centrally located respectively in each of the fluid conducting channels 44, 46 for the purpose of communicating of a cooling fluid therethrough. This is accomplished by threading the passage 48, 50 inwardly at both its upper and lower face, and inserting therein appropriate nipples 52 adapted to receive and connect conduits, suitably constructed of nylon, or other synthetic materials.

A 180° conduit bend 54 connects the passages 48 and 50 on the upper end of the diode mounting heat sink assembly 24, and cooling fluid is traversed therethrough the heat sink 24 by connecting one of the lower passages 48 to the discharge side of a pump (not shown) by means of conduit, and further connecting the passage 50 by means of conduit to the suction side thereto.

The temperature of the cooling fluid is controlled either by a temperature sensing or a condensate sensing system. In the latter system, the condensate is sensed by means of a sensor assembly 50, the sensor assembly controlling a solenoid which controls the flow of cooling fluid to the connection 52. For further details of the condensate sensing system, reference is made to copending application of Messrs. Minbiole and Mapham, Ser. No. 88,342, filed Nov. 10, 1970, for Condensate Sensing System, the disclosure of which is incorporated herein by reference. With reference to FIG. 1, it will be noted that an expansion tank is indicated at 58 which is another component of the above described system.

In the illustrated embodiment, two sets of parallel diodes are illustrated as being supported by the diode support assemblies 24, 26, 28. The first set of diodes 60, 64, 68, and the second set of diodes are illustrated at 62, 66, 70. In the embodiment illustrated, the current flows from the secondary of the upper transformer 12 through the bus bar 30 to the diode mounting heat sink assembly 28 and through a pair of diodes 60 and 62. Similarly, current flows from the secondary of the transformer 14 through the bus bar 38, through the diode mounting heat sink assembly 26 to the diodes 64 and 66, and from the third transformer 16 through the conductor 40 to the third set of diodes 68 and 70 through the third diode mounting heat sink assembly 24. Conversely, the description of the remaining non-described diode mounting heat sinks 30, 32, 34 are respectively similar to the details of the diode support heat sinks 24, 26, 28.

Figures 3, 4, 5, 6:
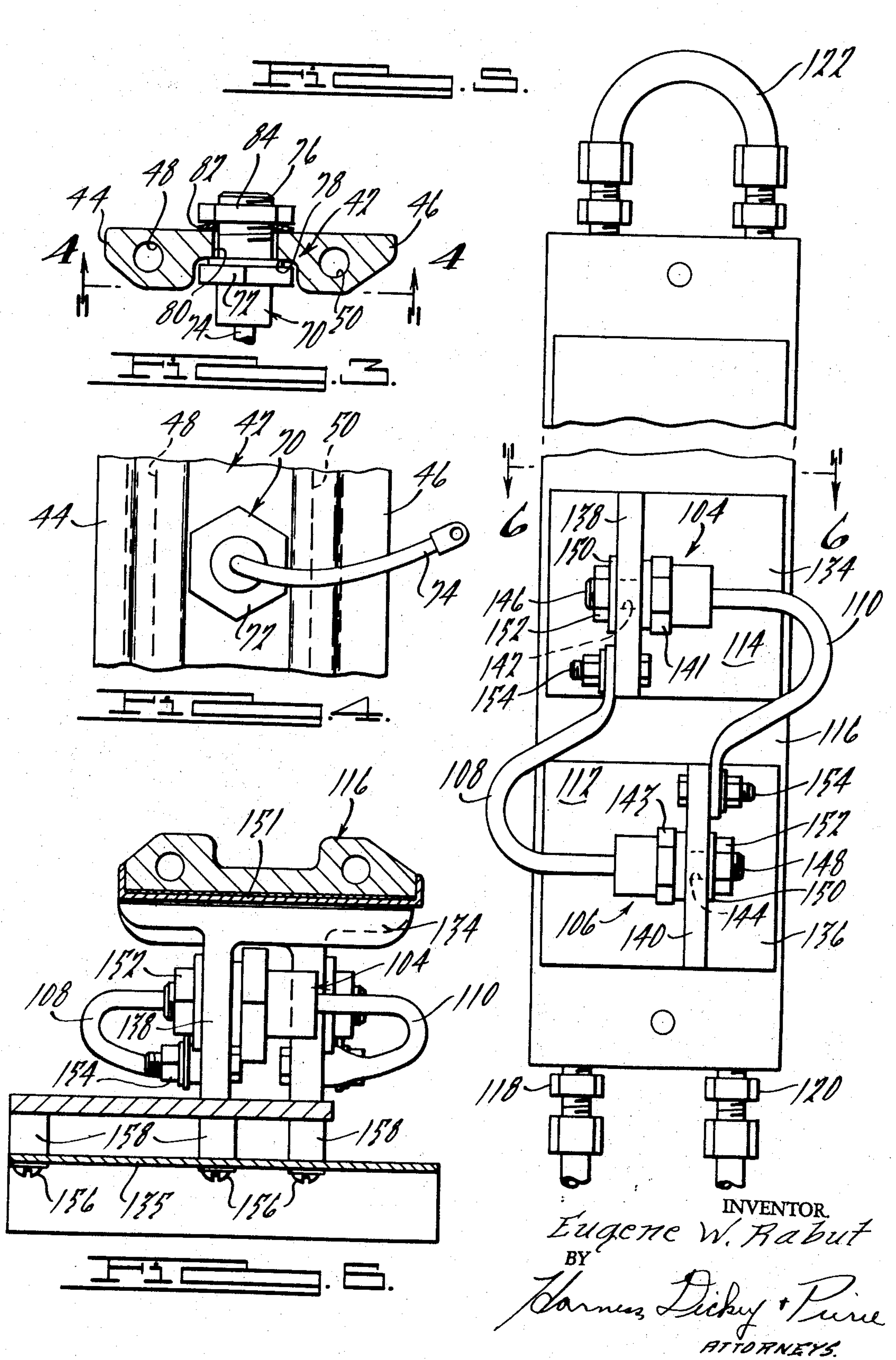
FIG. 3 is a cross-sectional view of one of the diode mounting assemblies, taken along the lines 3—3 of FIG. 2.
FIG. 4 is a fragmentary side elevation of the cross section of FIG. 3 as viewed from the lines 4—4.
FIG. 5 is an enlarged fragmentary front elevation of the heat sink and T-bar support assemblies as illustrated in FIG. 1.
FIG. 6 is a transverse cross-sectional elevation taken along the lines 6—6 of FIG. 5.

As best observed in FIGS. 3 and 4, the diodes 70, etc., may be selected from any of the well known and commercially available rectifying cells employing semiconductor materials such as selenium, or silicon, and having a radially extending hexagonally shaped flange or shoulder 72. The diode 70 is further comprised of a pigtail conductor 74 projecting rearwardly of the diode 70 and a forwardly extending threaded stud or mounting portion 76. Preferably, the stud portion 76 is constructed of copper having nickel, or silver, plated thereover so that the possibility of a gradual deterioration of the joint due to galvanic action, and an increase in thermal resistance, is reduced.

As shall now become apparent, a bore 80 of a diameter slightly larger than stud 76 is centrally disposed therethrough the recess 78. Further, it will be appreciated that the width of the recess 78 is preselected to be slightly larger than the distance across the flats of the hexagonal shoulder 72, but relatively less than the distance across the hexagonal corners thereof. The diode 70 is engaged to diode mounting heat sink assembly 42, by extending therethrough from its rearward side, the stud 76 of the diode 70 therein the bore 80. The stud 76 is then retained by means of a Belleville spring washer 82 and a nut 84. It will be apparent that no wrench contact need be made on the rear portion of the diode 70 when tightening the nut 84, the flats of the hexagonal shoulder 72 being rotatably restricted by the side walls of the recess 78. Further, the effect of torque relaxation is minimized by means of the Belleville spring washer 82.

In the front view of the rectifier unit 10 illustrated in FIG. 1, the interconnections between the diodes 60, 62, 64, 66, 68, 70 are illustrated wherein the pigtail conductor 74 is bolted to the bus 88 of an interphase transformer 90. Thus, current flows from the diodes in FIG. 1 to the respective windings of parallel interphase transformer assembly 90. The windings are center tapped by means of a common bus, this bus being disposed generally vertically and appears at the top of FIGS. 1 at 92. The ends of the bus bar are bolted to a standard shunt resistor 94 and then to an output bus assembly 96 by means of a plurality of bolts.

The standard shunt 94 provides a voltage signal for the current controlling circuits normally utilized in a rectifier system of this type, the circuits being illustrated in copending application of James H. Galloway, Ser. No. 5069 filed Jan. 2, 1970 now U.S. Pat. No.

3,590,323, for Peak Current Limiting System, and a copending application of James H. Galloway, Ser. No. 88,340 filed Nov. 10, 1970, now U.S. Pat. No. 3,714,540, for Isolation and Transforming Circuit, the disclosures of which are incorporated herein by reference.

The rectifier of the present invention is provided with control circuits which are housed either in a panel mounted on the door of the rectifier assembly, or are mounted in an area, designated by the reference numeral 132 above the rectifier panel. Certain other sensing signals are provided as for example by current transformers 98, 100, 102, these latter signals sensing the current flowing in the incoming line before it is fed to the main transformer units 12, 14, 16.

The current flowing in the primary windings of the main transformer unit 12, 14, 16, are controlled by a plurality of controlled rectifier devices 104, 108, et. (see FIGS. 5 and 6), which are connected, in any one phase, in parallel, back-to-back relation by means of a pair of pigtail connectors 108, 110, normally supplied with control devices of this type. The controlled rectifiers 104, 106 are mounted on T-shaped heat sink assemblies 112, 114, respectively, which are in turn fastened to a main heat sink assembly 116 by means of a suitable heat conducting, but electrically insulating epoxy. The heat sink assembly 116 is generally of the same configuration as was described in conjunction with the diode mounting heat sink assemblies 24, 26, 28, 30, 32, 34 with the exception that the semi-conductive devices are supported by the epoxy.

As was the case with the heat sink assemblies 24, 26, 28, 30, 32, 34, suitable inlet connections 118 are provided for supplying cooling fluid thereto, the outlet being provided at a connection 120. The connection between the tubular extruded apertures within the heat sink assembly 118 is provided by means of a tubing 122.

The control rectifiers, for example 104, 106, etc., are fired by a control firing package housed in the area 132 and a low voltage output signal from the firing package is supplied by a plurality of pulse transformers 124, 126, 128, 130. It will be noted that pulse transformers 124, 126, 128, 130 are positioned proximate all the controlled rectifiers 106, 108, etc., to be fired, thereby permitting a low voltage to be impressed on the conductors between the firing package and the area 132 and the pulse transformers 124, 126, 128, 130. It will be noted that two pairs of controlled rectifiers are supported behind the circuit board 136, 138, and the circuit board supplying the firing pulse for controlled rectifiers 106 and 108 have been removed for clarity.

With respect now to FIGS. 5 and 6, each of the T-shaped brackets 112, 114 is comprised of a base or web portion 134, 136 and an integral rectangularly shaped, flange or channel portion 138, 140 extending therefrom. Preferably, the flange portion 138, 140 is offset from the vertical centerline of the base portion 134, 136 for purposes that shall become apparent as this specification proceeds.

A bore 142, 144 is disposed in the flange portion 138, 140, a preselected distance from the base portion 134, 136, the distance from the centerline of the bore to the base 134, 136 being slightly greater than half the distance across the flats of 141, 143 or hexagonal shoulder which extends radially outwardly from the body portion of a pair of the controlled rectifier devices 104, 106, but less than half the distance across the hexagonal corners thereof. By preselecting this distance, it will be appreciated that the controlled rectifier devices are adapted to be self lockingly installed in a manner corresponding to that of the diodes 60, 62, 64, 66, 68, 70. The controlled rectifier devices 104, 106 are detachably engaged to the T-shaped bracket 114, 112 by inserting a forwardly extending stud portion 146, 148 of the rectifier device 104, 106 through the bore 142, 144. Since the rectifier device 104, 106 is not free to rotate due to the interference provided by the preselected distance between the bore 142, 144 and the base 134, 136, the rectifier device is simply connected thereto the flange portions 138, 140 by means of a Belleville spring washer 150 and a nut 152. As in the case of the diodes 60, 62, 64, 66, 68, 70, preferably the copper stud 146, 148 of the rectifier device is also plated with either nickel, or silver, for the same reason as for the diodes 60, 62, 64, 66, 68, 70.

As indicated previously, the flanges are offset from the base 134, 136 so as to accommodate the parallel, back to back, connection of the controlled rectifier devices 104 and 106. As shown in FIG. 5, the pigtail connections 110, 108 are respectively connected to the flange portion of the opposite T-shaped bracket 112, 114 by means of a stud, washer, and nut assembly 154. Other electrical connections (not shown) engaging the flange portion of the T-shaped bracket include an input phase lead connection from the power source, and an output connection to the main transformer unit 12, 14, 16.

The T-shaped brackets 112, 114, notably the outer surface of the bases 134, 136, are prepared prior to being fastened to the heat sink 116, which correspondingly also has its mating surface prepared. The preparation is comprised of painting the corresponding surfaces with a spray epoxy, such as Wakefield Delta Coat No. 151–H for the purpose of removing air bubbles, which reduces the possibility of oxidation due to the trapped air bubbles. After suitable preparation, the members are fastened together by means of second epoxy 151, such as Wakefield Delta Bond No. 152–E. Functionally, the epoxy 151 must be heat conductive but electrically insulative.

Completing the connections to the flange of the T-shaped bracket and as illustrated in FIG. 6, the circuit boards 135, 137 connect the outer face of the flange as by a cap screw 156-insulator 158 combination.

With reference again to FIGS. 1 and 2, it will be appreciated that the entire rectifier assembly 10 is supported by a plurality of channels 160, 162, 164, 166, 168, 170, as is common in the art, and suitably sealed by various panel sections forming a corrosion proof cabinet, so that the circuiting is sealed and never exposed to corrosive atmospheres. The cabinet construction indicated above is adapted to prolong the life expectancy of the rectifier assembly 10 and contribute to maintenance free performance during the life thereof.

While it will be appreciated that the embodiments illustrated herein are well calculated to fulfill the objects above stated, it will be appreciated that the present invention is susceptible to modification, variation and change without departing from the scope of the invention.

What is claimed is:

1. In an electrical rectifying apparatus including at least one semi-conductive device having a longitudinally extending, generally cylindrically shaped mounting section located at one end thereof, and a radially enlarged flange located at an inward end of said mounting section and having at least one flat marginal edge, the improvement comprising heat transfer means for cooling said device including a heat sink having first and second oppositely spaced outer walls and an aperture extending therebetween, said mounting section of said device being engageably located in said aperture with said flange abutting one of said walls, interference means associated with said one wall and radially spaced a preselected distance from the central axis of said aperture for cooperating with said flat marginal edge of said flange whereby to preclude relative rotational movement between said device and said heat sink, and attachment means acting on the other of said walls for securing said device to said sink.

2. The improvement as recited in claim 1 which includes means interposed between said attachment means and said other wall for precluding relaxation therebetween.

3. The improvement as recited in claim 2 wherein said mounting section is threaded, wherein said attachment means is a threaded fastener, and wherein said last mentioned means is a Belleville washer.

4. The improvement as recited in claim 1 wherein said heat sink includes fluid passage means for effecting a heat transfer away from said device.

5. The improvement as recited in claim 1 wherein said heat sink comprises a web portion and at least one flange portion formed along one marginal edge of said web and generally perpendicular therewith, said interference means being at least partially formed by a marginal edge of said flange portion.

6. The improvement as recited in claim 5 wherein said flange of said device is hexagonally shaped, wherein said heat sink further comprises a second flange portion formed along an opposite marginal edge of said web portion relative to said one flange portion and also being generally perpendicular therewith, a pair of oppositely spaced flats defined by said hexagonally shaped flange being disposed in close proximity to said flanges whereby to preclude relative rotational movement between said sink and said device.

7. The improvement as recited in claim 6 which includes fluid passage means formed in each of said flanges for effecting a heat transfer away from said heat sink.

8. In combination with a semi-conductive device having a threaded mounting section located at one axial end and a radially enlarged shoulder section disposed at an inward end of said mounting section, said shoulder section including at least one generally flat marginal edge; a heat sink comprising a web section having an aperture for engageably receiving said mounting section of said device, means located on one side of said web section and projecting outwardly therefrom to cooperate with said flat marginal edge of said shoulder of said device for precluding relative rotational movement between said device and said sink, and attachment means located on an opposite side of said web section for mounting said device to said sink.

9. The combination as recited in claim 8 wherein said shoulder section is hexagonally shaped, and wherein said means includes first and second flanges located on opposite sides of said aperture and selectively spaced in conformance with the distance across the flats of said hexagonally shaped shoulder.

10. The combination as recited in claim 9 which includes fluid passage means formed in each of said flanges for transferring heat away from said device.

* * * * *